US006993691B2

(12) United States Patent
Ogiwara et al.

(10) Patent No.: US 6,993,691 B2
(45) Date of Patent: Jan. 31, 2006

(54) SERIES CONNECTED TC UNIT TYPE FERROELECTRIC RAM AND TEST METHOD THEREOF

(75) Inventors: Ryu Ogiwara, Yokohama (JP);
Daisaburo Takashima, Yokohama (JP);
Yukihito Oowaki, Yokohama (JP);
Katsuhiko Hoya, Yokohama (JP);
Takeshi Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 527 days.

(21) Appl. No.: 10/120,146

(22) Filed: Apr. 11, 2002

(65) Prior Publication Data

US 2002/0188893 A1 Dec. 12, 2002

(30) Foreign Application Priority Data

Apr. 17, 2001 (JP) .............................. 2001-118244

(51) Int. Cl.
*G11C 29/00* (2006.01)

(52) U.S. Cl. ...................... 714/721; 365/145
(58) Field of Classification Search ................ 714/721, 714/718, 25, 42, 54; 365/145
See application file for complete search history.

(56) References Cited

U.S. PATENT DOCUMENTS 5,903,492 A * 5/1999 Takashima ................... 365/145
6,301,145 B1 * 10/2001 Nishihara ..................... 365/145
6,658,608 B1 * 12/2003 Kamp et al. ................. 714/718

OTHER PUBLICATIONS

D. Takashima, et al., "High Density Chain Ferroelectric Random-Access Memory (CFRAM)", VLSI Circuit Symposium, 1997, p. 83-84.
D. Takashima, et al., "A Sub-40ns Random-Access Chain FRAM Architecture with a 7ns Cell-Plate-Line Drive", ISSCC Digest of Technical Papers, Feb. 1999, p. 102-103.

* cited by examiner

*Primary Examiner*—Albert Decady
*Assistant Examiner*—Dipakkumar Gandhi
(74) *Attorney, Agent, or Firm*—Banner & Witcoff, Ltd.

(57) ABSTRACT

Potential of a word line connected to any selected one of memory cells is lowered and potential of word lines connected to non-selected memory cells are raised. The potential of the plate line is raised and lowered. The potential of the bit line is raised and lowered. After this, reading data from the memory cells after potential raising and lowering of the plate line and potential raising and lowering of the bit line have been alternately performed at least one time, thereby to determine attenuation of polarization in the ferroelectric capacitor.

7 Claims, 13 Drawing Sheets

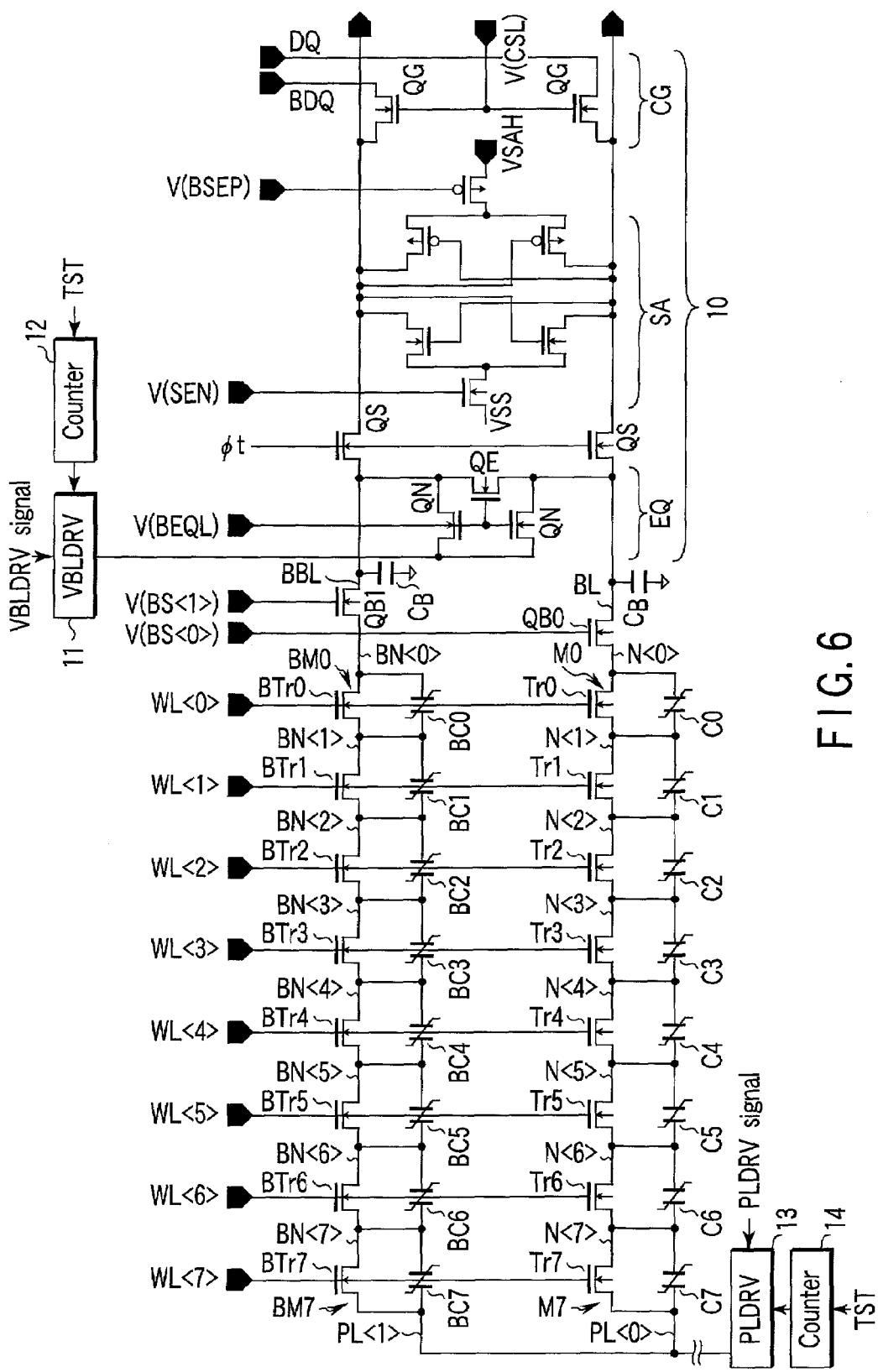
F I G. 6

SERIES CONNECTED TC UNIT TYPE FERROELECTRIC RAM AND TEST METHOD THEREOF

CROSS-REFERENCE TO RELATED APPLICATIONS

This application is based upon and claims the benefit of priority from the prior Japanese Patent Application No. 2001-118244, filed Apr. 17, 2001, the entire contents of which are incorporated herein by reference.

BACKGROUND OF THE INVENTION

1. Field of the Invention

This invention relates to a ferroelectric memory and a test method thereof and more particularly to a memory which consists of series connected memory cells each having a transistor (T) having a source terminal and a drain terminal and a ferroelectric capacitor (C) in between the two terminals, hereafter named "series connected TC unit type ferroelectric RAM".

2. Description of the Related Art

Recently, ferroelectric memory has rapidly developed. Although the memory is of a nonvolatile type, it has an advantage over a flash memory which is also a nonvolatile device in that the number of rewritable operations is large, the programming time is short and operation with the low voltage/low-power consumption can be performed.

However, when the device is compared with a DRAM, the device has a disadvantage that the cell size cannot be made smaller than $8F^2$ (F is the minimum line width determined by the design rule) because the device is formed with the folded bit line structure and the operation speed is lower than that of the DRAM since it is necessary to drive a plate line having large capacitance.

Therefore, in order to solve the above problems, the "series connected TC unit type ferroelectric RAM" was proposed in VLSI Circuit Sympo. 1997 pp. 83 to 84 "High-Density Chain Ferroelectric Random Access Memory (CFRAM)" and ISSCC Tech. Dig. Papers, pp. 102 to 103, February 1999 "A Sub-40 ns Random-Access Chain FRAM Architecture with 7 ns Cell-Plate-Line Drive". It is described in the above reports that higher speed operation and higher integration density can be attained in comparison with an FeRAM which is conventionally known since the cell size is half that of the latter and the bit line capacitance is ¼ times that of the latter.

However, when the series connected TC unit type ferroelectric RAM performs the operation shown in the following table 1, a potential difference, that is, a disturbance occurs between two ends of each memory cell capacitor so as to reduce the remnant polarization amount.

TABLE 1

| Plate Driving System | Word Line to be Selected | Operation |
| --- | --- | --- |
| Single Plate Pulse System | WL<0> | Program "1" from outside the chip after data "0" is read out |

FIG. 1 is a schematic configuration diagram showing a series connected TC unit type ferroelectric RAM which was formed before the solution to the above problem was made according to the prior Japanese Patent Application (Jpn. Pat. Appln. KOKAI Publication No. 2000-339973) by the inventors of this application and others. In FIG. 1, an extracted part of the memory cell array and peripheral circuit is shown.

That is, in FIG. 1, memory cell units are arranged in matrix form in a memory cell region. Each memory cell unit is formed by serially connecting a plurality of memory cells which are each formed by respectively connecting two electrodes of a ferroelectric capacitor to source and drain terminals of an enhancement type (E type) N-channel MIS transistor.

In this example, two memory cell units which are respectively formed of series-connected eight memory cells M0 to M7 and BM0 to BM7, for example, are typically shown. The cells M0 to M7 are respectively formed of transistors Tr0 to Tr7 and capacitors C0 to C7 and the cells BM0 to BM7 are respectively formed of transistors BTr0 to BTr7 and capacitors BC0 to BC7.

The gate electrodes of the transistors Tr0 to Tr7, BTr0 to BTr7 are respectively connected to corresponding word lines WL<0> to WL<7>. Further, one end of the memory cell unit is connected to a plate line PL<0> or PL<1> and the other end thereof is connected to a bit line BL or bit line BBL which is complementary to the bit line BL via a block select MIS transistor (block selector) QB0 or QB1.

Further, the bit lines BL, BBL are connected to a sense amplifier region 10. In the sense amplifier region 10, an equalization circuit EQ, flip-flop type sense amplifier SA, column select gate CG and the like are formed.

The block select MIS transistors QB0, QB1 are respectively controlled by block select signals V(BS<0>), V(BS<1>). The equalization circuit EQ is controlled by an equalization control signal V(BEQL). The sense amplifier SA is controlled by sense amplifier activation control signals V(SEN), V(BSEP). Further, the column select gate CG is controlled by a column select signal V(CSL).

The timing chart of FIG. 2 shows the program operation of the device with the configuration shown in FIG. 1 in which a single plate pulse system realized in a two transistor-two capacitor (2T2C) configuration is used and data "1" is programmed from outside the chip after the word line WL<0> is selected to select the memory cell M0 and read out data "0" as the conventional program operation.

More specifically, first, after the potential level of the equalization control signal V(BEQL) is lowered to release the equalized state of the paired bit lines BL and BBL, the driving potential V(WL<0>) of the word line WL<0> is lowered to select a $0^{th}$ word line (at the end of the operation, the word line driving potential V(WL<0>) is raised). Then, the potentials of the plate lines PL<0>, PL<1> are raised to raise the plate line potentials V(PL0, PL1) and read out the polarization of the memory cell onto the bit line pair BL, BBL in the form of charge. Next, the sense amplifier activation control signals V(SEN) and V(BSEP) are respectively set to high and low levels to activate the sense amplifier SA and compare and amplifier potential difference occurring between the paired bit lines BL and BBL. At this time, the polarization of the capacitor C0 in the memory cell M0 is set in a direction toward the sense amplifier SA from the plate line PL<0>, that is, data stored in the memory cell M0 is "0". Therefore, as the result of comparison and amplification, the potentials of the nodes N<1> to N<7> are the plate line raising potentials and the potential of the node N<0> is 0 V. After this, the column select line SL is selected with the sense amplifier SA kept activated and "1" data is programmed from the data line pair DQ, BDQ via the DQ gate QG. Then, as shown in FIG. 3, when the word line raising potential is low, the potentials of the nodes N<1> to N<7> are largely booted, and at the same time, potential differences occur between the nodes N<7> and N<6>, nodes N<6> and N<5>, nodes N<5> and N<4>, nodes N<4> and N<3>, nodes N<3> and N<2>, and nodes N<2> and N<1>. The reason for this is explained below.

Since the potential is further booted from the plate line raising potential by the sense amplifier SA, the cell transfer gates Tr0 to Tr7 are turned OFF because of the rise in the threshold voltages due to the substrate bias effect. Since the potential is further booted by the sense amplifier SA after they are turned OFF, a portion amplified after they are turned OFF is capacitively divided by capacitive components connected between the sense amplifier SA and the cell transfer gates which are turned OFF. As a result, a potential difference occurs across each cell transfer gate and acts as a disturbance which reduces the remnant polarization amount.

According to the waveform diagram shown in FIG. 3, it is understood that large potential difference (disturb) occurs, particularly, between the nodes N<2> and N<1>. At this time, if the polarization of the capacitor C1 in the non-selected memory cell M1 is set in a direction toward the sense amplifier SA from the plate line PL<1>, that is, data stored in the non-selected memory cell M1 is "0", an electric field which reduces the remnant polarization amount is applied. It is specifically described in the prior Japanese Patent Application (Jpn. Pat. Appln. KOKAI Publication No. 2000-339973) that disturbance will occur in cases as shown in the following table 2 and table 3 in an operation other than the operation described above.

TABLE 2

| Plate Driving System | Word Line to be Selected | Operation |
|---|---|---|
| Double Plate Pulse System | WL<0> | Program "1" from outside the chip after data "0" is read out |

TABLE 3

| Plate Driving System | Word Line to be Selected | Operation |
|---|---|---|
| Double Plate Pulse System | WL<7> | When data "1" is read out |

The following countermeasure is proposed in the prior Japanese Patent Application (Jpn. Pat. Appln. KOKAI Publication No. 2000-339973) to solve the above problems.

FIG. 4 is a circuit diagram showing the schematic configuration of a "series connected TC unit type ferroelectric RAM" designed to solve the above problems. FIG. 5 is a timing chart for illustrating a series of readout operation and program operation from outside the chip in a single plate pulse system and a waveform diagram showing detail transition of the potentials of the respective nodes shown in the memory cell region of FIG. 4 at the time of the above operations.

In this example, a case wherein the word line WL<0> is selected in a two transistor-two capacitor system is considered. Further, assume that the polarization which is set in a direction toward the bit line BL from the plate line PL<0> occurs in the capacitor C0 of the memory cell M0 which lies on the bit line BL side among the cells selected by the word line, that is, data "0" is programmed in the cell M0 and the polarization which is set in a direction toward the plate line PL<1> from the bit line BBL occurs in the capacitor BC0 of the memory cell BM0 which lies on the bit line BBL side, that is, data "1" is programmed in the cell BM0. In this example, a case wherein data "0" is read out from the memory cell M0 and then data "1" is programmed from outside the chip is explained below.

The operation of the above circuit is specifically explained below with reference to FIG. 5. First, the equalization control signal V(BEQL) is lowered to a low level to release the equalized state of the paired bit lines BL and BBL and make preparation for readout of data onto the bit lines. Next, the potential of the word line WL<0> is set from a high level (VPP) to the low level (0 V) to make preparation for application of potential difference between two ends of the cell. After this, the block select signals V(BS<0>, V(BS<1>) are raised from the low level (0 V) to the high level (VPP) so as to raise the plate lines (PL<0>, PL<1>) from the low level to the high level and consequently read out data onto the paired bit lines BL, BBL.

Next, φt gates (separation transistors) QS are turned OFF by setting a separation control signal φt to the low level (0 V) from the high level (VPP) so as to separate portions of the paired bit lines BL, BBL in the memory cell array region from portions thereof in the sense amplifier region. In this state, the sense amplifier activation signals V(SAN), V(SAP) are respectively set to the high and low levels to perform the sense and amplification operation. While the separation operation is being performed, the potential V(CSL) of a column select line CSL is raised to read out data to outside the chip or program data from outside.

Data "0" is programmed into both of the memory cells M0 and BM0 by equalizing the paired bit lines BL, BBL to 0 V after the φt gates QS are turned OFF, that is, the direction of the polarization of the capacitors C0 and BC0 is set in a direction toward the bit line from the plate line. Then, the plate line potentials V(PL<0>, V(PL<1>) are set to 0 V to release the equalized state and set the paired bit lines BL, BBL into an electrically floating state again. After this, data latched in the sense amplifier SA is programmed onto the paired bit lines BL, BBL by turning ON the φt gates QS. At this time, if the potential of a portion of the sense amplifier region 10 which lies on the bit line BL side is set at the high level, polarization set in a direction toward the plate line from the bit line is newly programmed (the direction of the polarization is set again), but if the potential is set at the low level, data which is first programmed and set in a direction toward the bit line from the plate line is kept programmed as it is (the direction of the polarization is kept unchanged). In this example, the polarization set in a direction toward the plate line from the bit line is programmed in the capacitor C0 of the memory cell M0 and data set in a direction toward the bit line from the plate line is kept programmed as it is in the capacitor BC0 of the memory cell BM0. Therefore, both of the plate line and bit line will not simultaneously set at the high level and the problem described before will not occur. Further, the effect that imbalance of the cell capacitor is prevented from appearing can be attained by performing the sense and amplification operation after the φt gates QS are turned OFF.

In the above explanation, a two transistor-two capacitor configuration is used, but in the case of one transistor-one capacitor (1T1C) operation, it can be easily attained by activating the plate line PL<0> or PL<1> and the block select signal V(BS<0>) or V(BS<1>) and separately creating reference potential. The countermeasure for the operations of the table 2 and table 3 is described in detail in the prior Japanese Patent Application (Jpn. Pat. Appln. KOKAI Publication No. 2000-339973).

However, the "series connected TC unit type ferroelectric RAM" described in the above prior Japanese Patent Application has some room for further improvement as described below.

(#1)

If the readout/inverted data program operation is repeatedly performed as described above in order to make a fatigue test for a ferroelectric capacitor of a cell, it takes a long time to control the sense amplifier and φt gates. Therefore, it is impossible to make an evaluation in a short time.

(#2)

When a reduction in the polarization amount due to disturb which occurs one time or plural times in a non-selected cell is tested and if the readout/inverted data program operation is repeatedly performed while the φt gates are kept in the ON state, it takes a long time to control the sense amplifier. From this point of view, it is impossible to make an evaluation in a short time.

(#3)

The potential of the word line WL<0> is lowered at the start time of the operation and raised at the end time of the operation. At this time, an electric field set in a direction toward the bit line from the plate line occurs at the operation start time as indicated by ΔC in FIG. 5 in the ferroelectric capacitor of the non-selected memory cell M1 or BM1 by coupling between the word line WL<0> and an electrode which lies near the plate line of the non-selected memory cell M1 or BM1. Further, an electric field set in a direction toward the plate line from the bit line occurs at the operation end time as indicated by ΔD. If polarization in the direction toward the bit line from the plate line previously occurs in the capacitor C1 of the non-selected memory cell M1 and polarization in the direction toward the plate line from the bit line previously occurs in the capacitor BC1 of the non-selected memory cell BM1, disturbance occurs in the cell BM1 at the operation start time and in the cell M1 at the operation time and there occurs a possibility that the polarization amount may be reduced.

In addition, if the readout/program operation is performed by one time or plural times, disturb to the adjacent cell M1 or BM1 due to a lowering/rise in the potential of the word line WL<0> cannot be evaluated in a short time.

(#4)

A case wherein the word line WL<0> is selected is considered. FIG. 5 is a timing chart and waveform diagram corresponding to FIG. 4 when the word line WL<0> is selected. Assume that polarization in a direction toward the plate line from the bit line previously occurs in the capacitor BC1 of the cell BM1, that is, data "1" is programmed in the cell BM1. When the potentials of the plate lines PL<0>, PL<1> are raised from the low level to the high level after the potential of the word line WL<0> is lowered at the time of the readout operation, a potential difference occurs between two electrodes of the ferroelectric capacitor BC1 of the cell BM1 due to the presence of the ON-resistance of the cell transistor BTr1 and the capacitive components of the cells BM1 to BM7. As a result, the polarization in the direction toward the plate line from the previously programmed bit line, that is, disturbance with respect to the data "1" occurs and there occurs a possibility that the polarization amount may be reduced.

Further, if the readout/program operation is performed by one time or plural times, a reduction in the polarization amount due to disturb applied to the cell BM1 when the potentials of the plate lines PL<0>, PL<1> are raised from the low level to the high level cannot be evaluated in a short time.

(#5)

A case wherein the word line WL<7> is selected is considered. Assume that polarization in the direction toward the bit line from the plate line occurs in the capacitor C6 of the cell M6, that is, data "0" is programmed in the cell M6. When the potential of the bit line is raised from the low level to the high level after the potential of the word line WL<7> is lowered at the time of the readout operation, a potential difference occurs between two electrodes of the ferroelectric capacitor of the cell M6 due to the presence of the ON-resistance of the cell transistor Tr6 and the capacitive components of the cells M0 to M6. As a result, the polarization in the direction toward the bit line from the previously programmed plate line, that is, disturbance with respect to data "0" occurs and there occurs a possibility that the polarization amount may be reduced (refer to ΔA, ΔB in FIG. 5).

Further, if the readout/program operation is performed by one time or plural times, a reduction in the polarization amount due to disturbance applied to the cell M6 when the potential of the bit line is raised from the low level to the high level cannot be evaluated in a short time.

Therefore, in order to solve the above problems, it is desired to further improve the series connected TC unit type ferroelectric RAM.

BRIEF SUMMARY OF THE INVENTION

According to an aspect of the present invention, there is provided a test method for a ferroelectric memory including a circuit of a plurality of series-connected memory cells which is connected at one end to a plate line, each of the plurality of series-connected memory cells including a first MIS transistor which has a gate electrode connected to a corresponding one of word lines, source terminal and drain terminal and a ferroelectric capacitor connected between the source terminal and the drain terminal, and a second MIS transistor having a current path which is connected at one end to the other end of the circuit of the plurality of series-connected memory cells and connected at the other end to a bit line, the test method comprising, lowering a potential of a word line connected to any selected one of the memory cells and raising a potential of word lines connected to non-selected memory cells, raising a potential of the plate line from a first potential to a second potential and then lowering the potential of the plate line from the second potential to the first potential, raising a potential of the bit line from a third potential to a fourth potential and then lowering the potential of the bit line from the fourth potential to the third potential, and reading data from the memory cells after the potentials of the plate line and bit line have been raised and lowered at least one time, thereby to determine attenuation of polarization in the ferroelectric capacitor, wherein the bit line remain at the third potential while the plate line is maintained at the second potential, and the plate line is maintained at the first potential while the bit line remains at the fourth potential.

According to another aspect of the present invention, there is provided test method for a ferroelectric memory including a circuit of a plurality of series-connected memory cells which is connected at one end to a plate line, each of the plurality of series-connected memory cells including a first MIS transistor which has a gate electrode connected to a corresponding one of word lines, source terminal and drain terminal and a ferroelectric capacitor connected between the source terminal and the drain terminal, and a second MIS transistor having a current path which is connected at one end to the other end of the circuit of the plurality of series-connected memory cells and connected at the other end to a bit line, the test method comprising, lowering a potential of a word line connected to any selected one of the memory cells and raising a potential of word lines connected to non-selected memory cells, raising a potential of the plate line to a prescribed value, maintaining the potential of the plate line at the prescribe value during a predetermined period, and lowering the potential of the plate line from the prescribed value, raising and lowering the potential of the bit line during the predetermined period, and reading data from the memory cells after the potentials of the plate line and bit line have been raised and lowered at least one time, thereby to determine attenuation of polarization in the ferroelectric capacitor.

According to still another aspect of the present invention, there is provided a test method for a ferroelectric memory including a circuit of a plurality of series-connected memory cells which is connected at one end to a plate line, each of the plurality of series-connected memory cells including a first MIS transistor which has a gate electrode connected to a corresponding one of word lines, source terminal and drain terminal and a ferroelectric capacitor connected between the source terminal and the drain terminal, and a second MIS transistor having a current path which is connected at one end to the other end of the circuit of the plurality of series-connected memory cells and connected at the other end to a bit line, the test method comprising, lowering a potential of a word line connected to any selected one of the memory cells and raising a potential of word lines connected to non-selected memory cells, raising a potential of the bit line to a prescribed value, maintaining the potential of the bit line at the prescribe value during a predetermined period, and lowering the potential of the bit line from the prescribed value, raising and lowering the potential of the plate line during the predetermined period, and reading data from the memory cells after the potentials of the plate line and bit line have been raised and lowered at least one time, thereby to determine attenuation of polarization in the ferroelectric capacitor.

According to still another aspect of the present invention, there is provided a test method for a ferroelectric memory including a circuit of a plurality of series-connected memory cells which is connected at one end to a plate line, each of the plurality of series-connected memory cells including a first MIS transistor which has a gate electrode connected to a corresponding one of word lines, source terminal and drain terminal and a ferroelectric capacitor connected between the source terminal and the drain terminal, and a second MIS transistor having a current path which is connected at one end to the other end of the circuit of the plurality of series-connected memory cells and connected at the other end to a bit line, the test method comprising, performing a word line selecting/non-selecting operation once or repeatedly plural times, and checking a reduction in a polarization amount of the ferroelectric capacitor by reading out data of the memory cell.

According to still another aspect of the present invention, there is provided a test method for a ferroelectric memory including a circuit of a plurality of series-connected memory cells which is connected at one end to a plate line, each of the plurality of series-connected memory cells including a first MIS transistor which has a gate electrode connected to a corresponding one of word lines, source terminal and drain terminal and a ferroelectric capacitor connected between the source terminal and the drain terminal, and a second MIS transistor having a current path which is connected at one end to the other end of the circuit of the plurality of series-connected memory cells and connected at the other end to a bit line, the test method comprising, selecting one of the word lines, performing plate line potential raising and lowering operations once or repeatedly plural times while potential of the bit line is kept constant, and checking a reduction in a polarization amount of the ferroelectric capacitor by reading out data of the memory cell.

According to still another aspect of the present invention, there is provided a ferroelectric memory comprising, a memory cell unit which is configured by serially connecting a plurality of memory cells each of which is configured by respectively connecting two electrodes of a ferroelectric capacitor to a source terminal and a drain terminal of a MIS transistor, a plurality of word lines respectively connected to gate electrodes of the MIS transistors of the memory cell unit, a plate line connected to one end of the memory cell unit, a plate driver which applies a fixed potential to the plate line in a normal operation mode and pulse-drives the plate line in a test mode, a bit line connected to the other end of the memory cell unit via a block select switch element, a bit line driver which applies a fixed potential to the bit line in the normal operation mode and pulse-drives the bit line in the test mode, a first counter which controls the plate driver in response to a test signal, and a second counter which controls the bit line driver in response to the test signal, wherein a pulse number and pulse width in the test mode are set based on count values of the first and second counters.

BRIEF DESCRIPTION OF THE SEVERAL VIEWS OF THE DRAWING

FIG. 6 is a circuit diagram showing the schematic configuration of a series connected TC unit type ferroelectric RAM, for illustrating a ferroelectric memory according to a first embodiment of this invention and a test method thereof;

DETAILED DESCRIPTION OF THE INVENTION

[First Embodiment]

Figure 1:
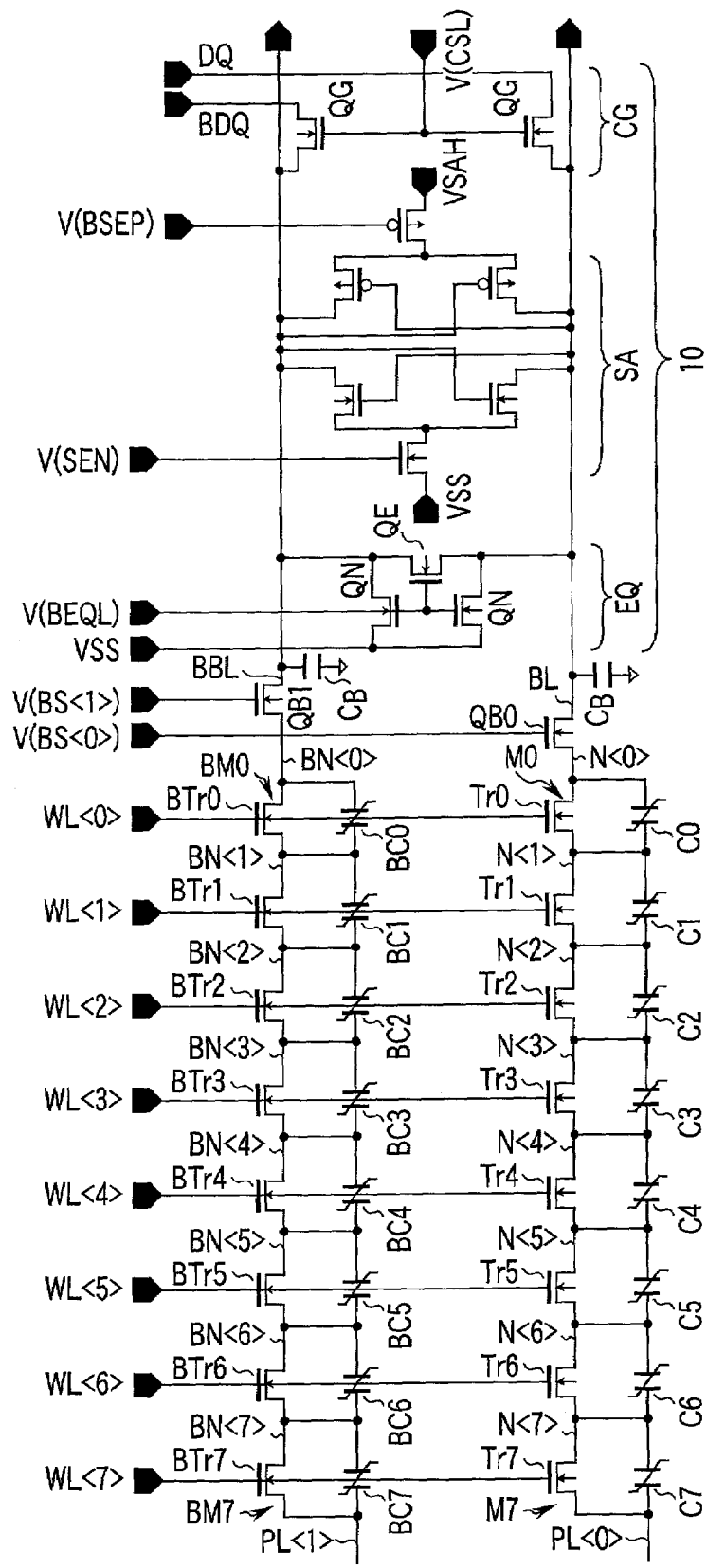
FIG. 1 is a circuit diagram showing the schematic configuration of a series connected TC unit type ferroelectric RAM, for illustrating the conventional ferroelectric memory and a test method thereof.
Figure 2:
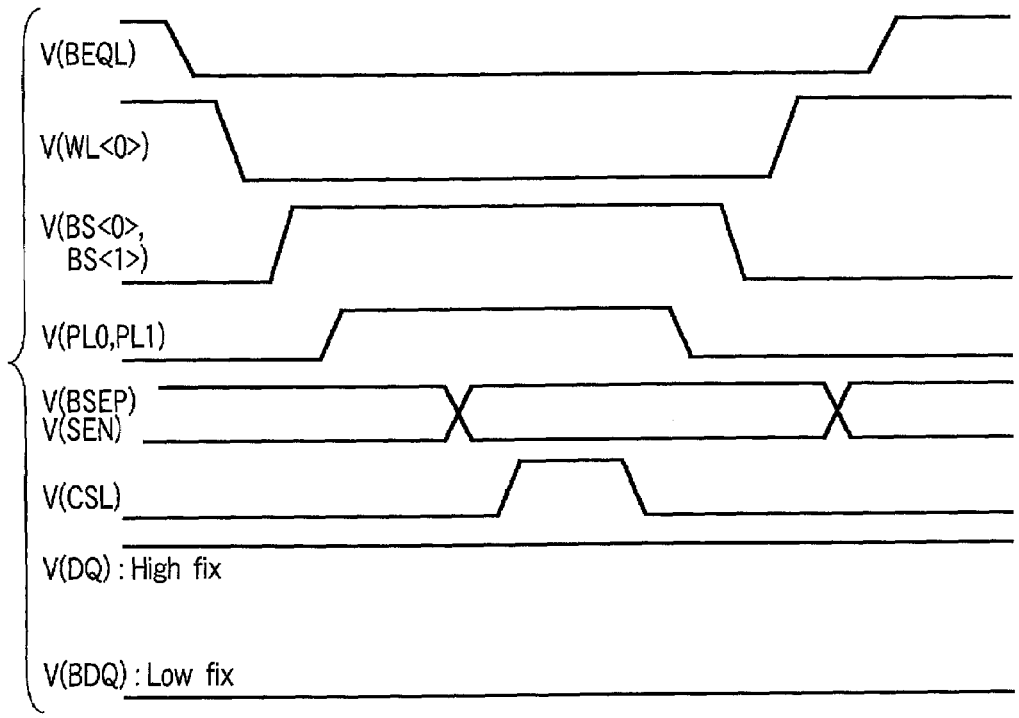
FIG. 2 is a timing chart for illustrating the program operation of a device with the configuration shown in FIG. 1 in which a single plate pulse system formed in a two transistor-two capacitor (2T2C) configuration is used and data "1" is programmed from outside a chip after a word line WL<0> is selected to select a memory cell M0 and read out data "0" as the conventional program operation.
Figure 3:
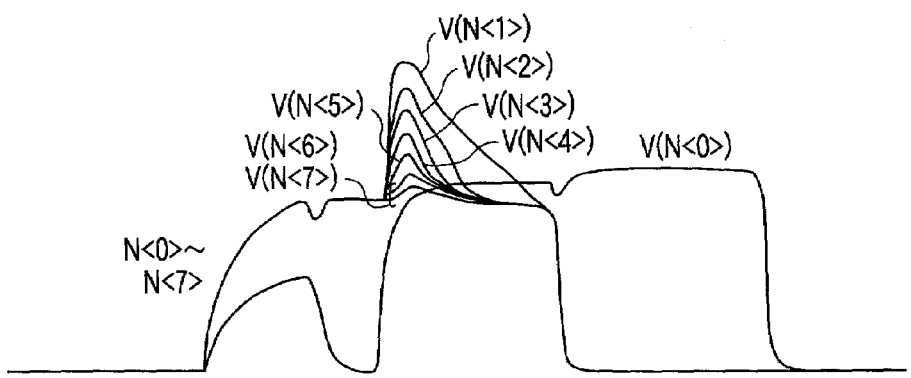
FIG. 3 is a waveform diagram specifically showing the transition of potentials of respective nodes of a memory cell region in the operation of FIG. 2.
Figure 4:
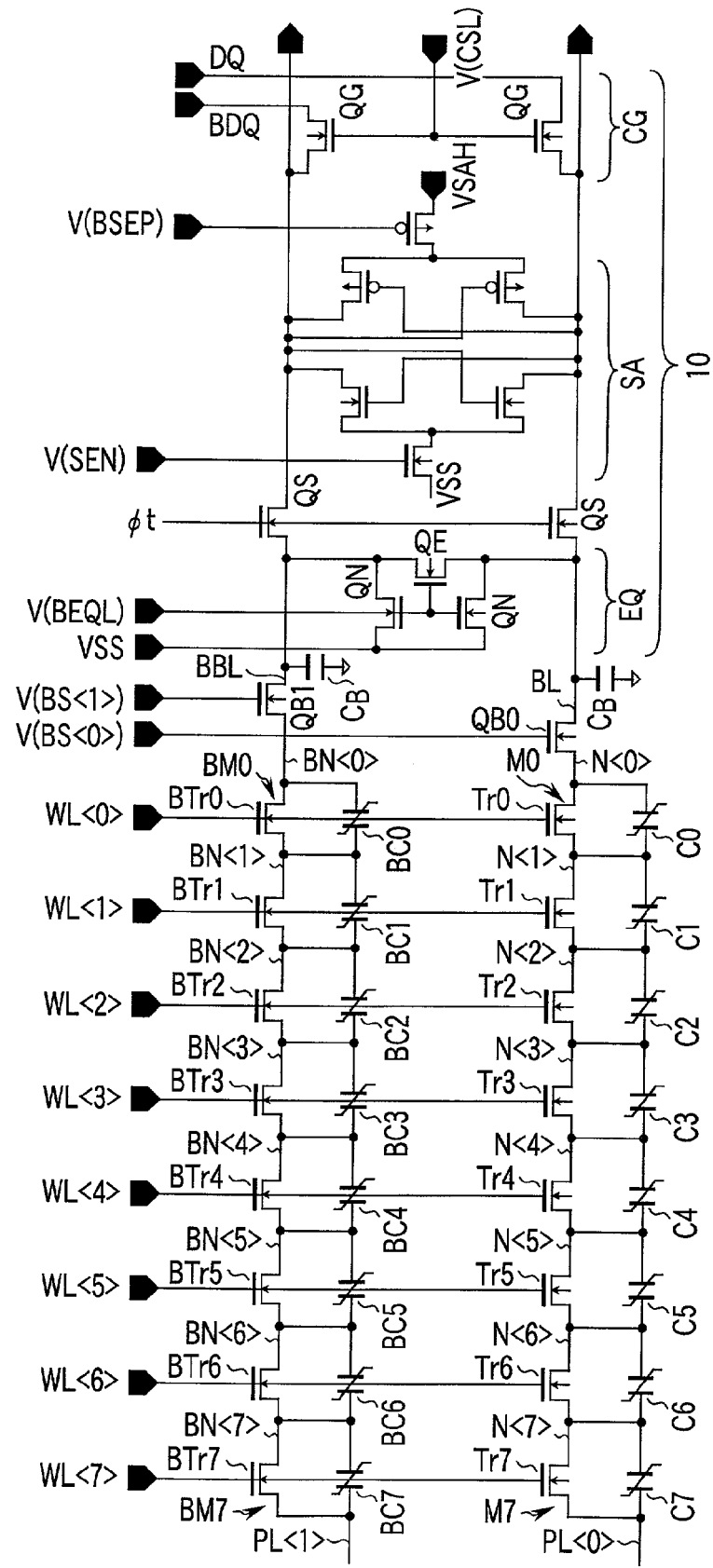
FIG. 4 is a circuit diagram showing the schematic configuration of a series connected TC unit type ferroelectric RAM which is designed to solve disturbance by forming a ϕt clocking gate between the memory cell array region and a sense amplifier region, for illustrating the conventional ferroelectric memory and a test method thereof.
Figure 5:
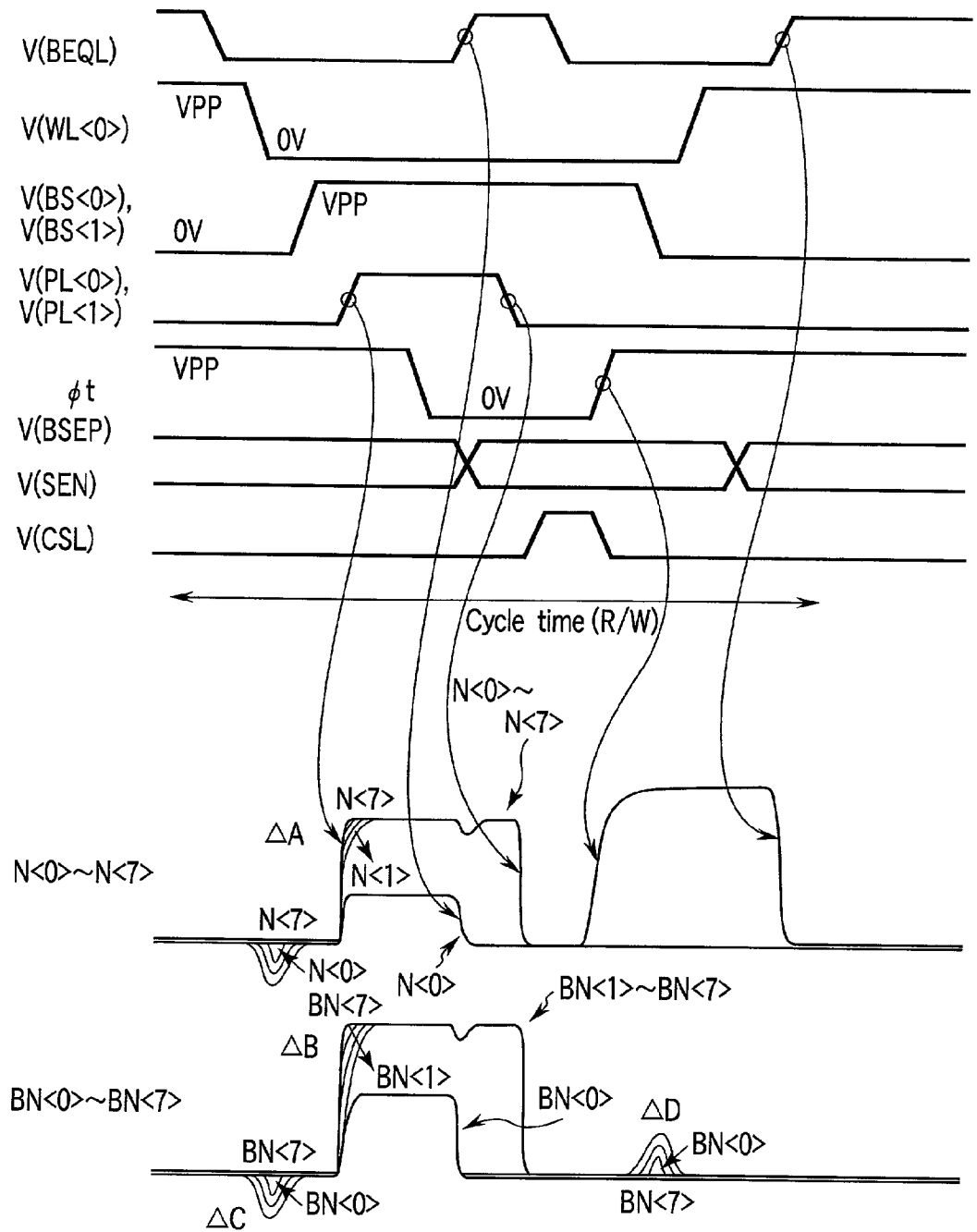
FIG. 5 is a timing chart showing the potentials of main nodes in a case where WL<0> is selected as a word line, data "0" is read out from a memory cell M0 and then data "1" is programmed from outside the chip when a single plate pulse operation is performed by the configuration of FIG. 4 and a waveform diagram specifically showing the transition of potentials of the respective nodes.
Figure 7:
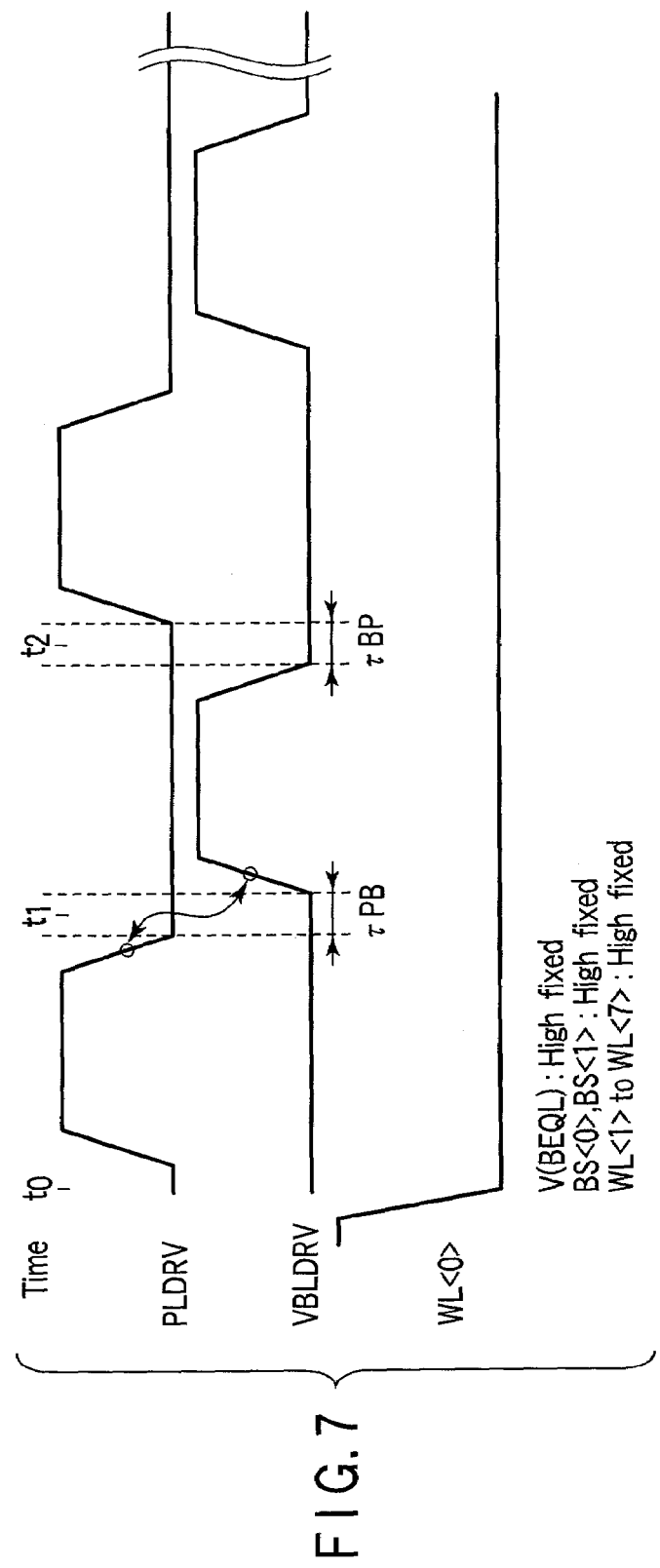
FIG. 7 is a timing chart showing a series of operations as a test mode operation of the circuit shown in FIG. 6.
Figure 8:
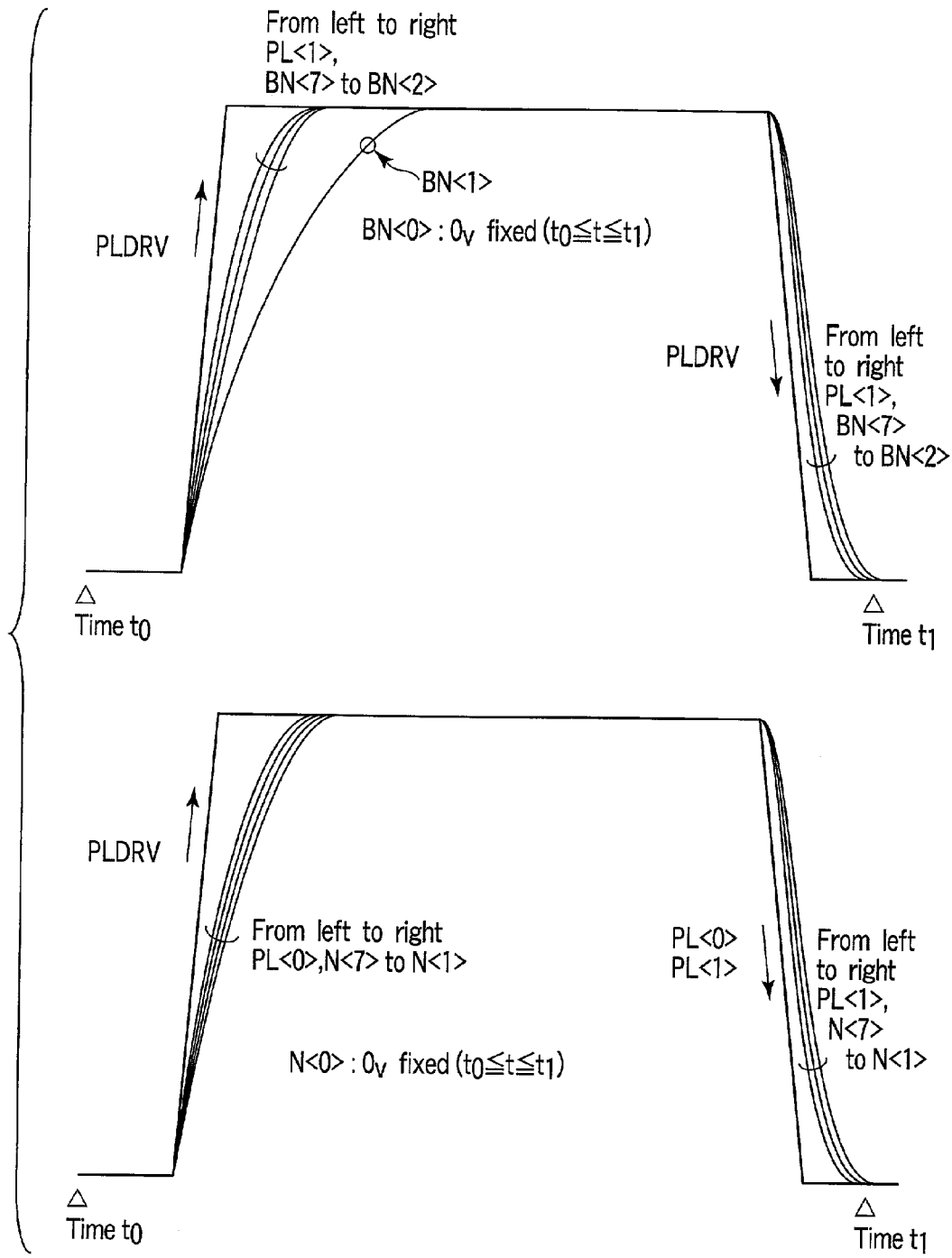
FIG. 8 is a waveform diagram specifically showing the transition of potentials of respective nodes shown in a memory cell region of FIG. 6 in a period from time t0 to time t1 in FIG. 7.
Figure 9:
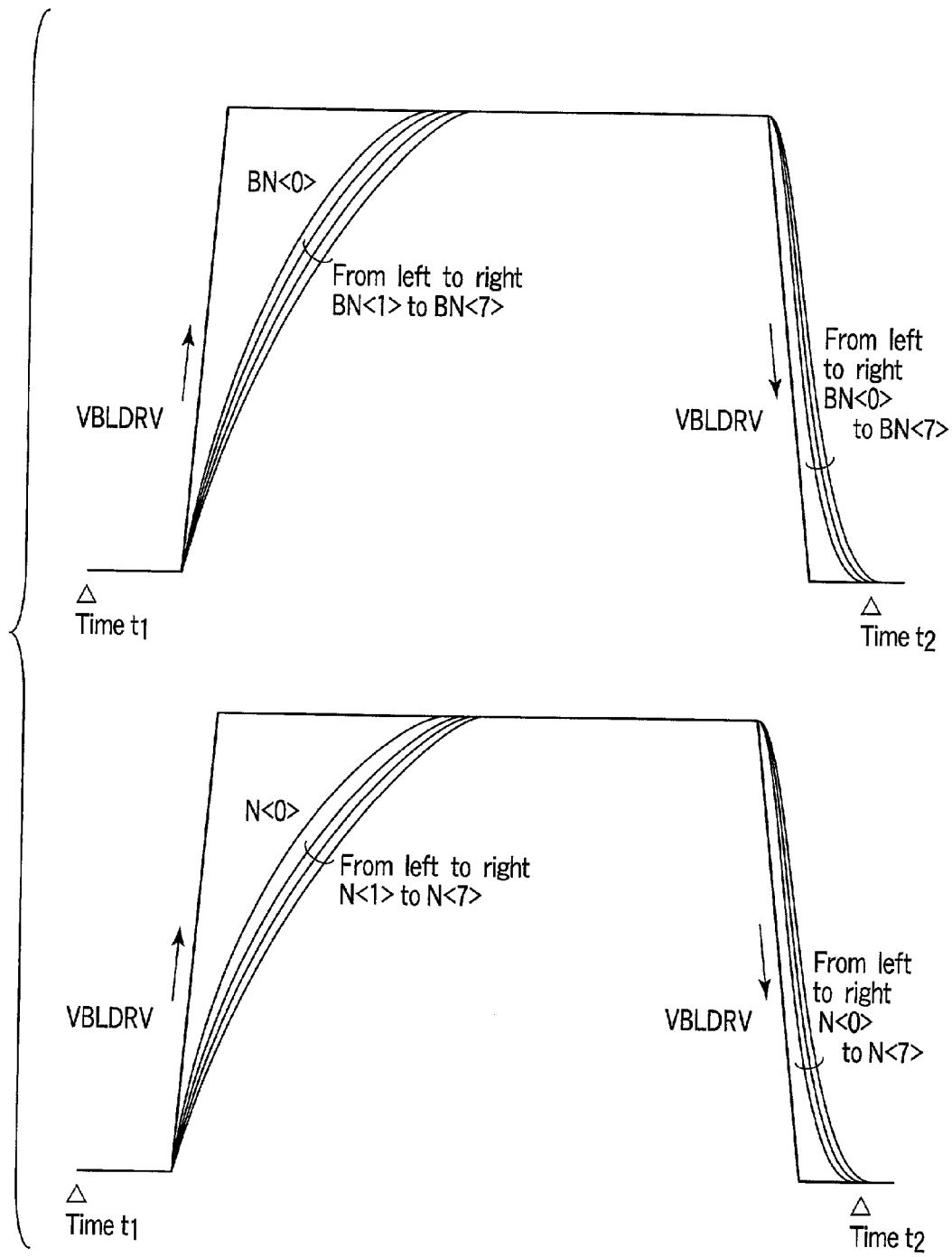
FIG. 9 is a waveform diagram specifically showing the transition of potentials of respective nodes shown in the memory cell region of FIG. 6 in a period from time t1 to time t2 in FIG. 7.

FIG. 6 shows the schematic configuration of a "series connected TC unit type ferroelectric RAM", particularly showing an extracted portion of a memory cell array and peripheral circuit thereof, for illustrating a ferroelectric memory according to a first embodiment of this invention. The circuit shown in FIG. 6 is configured by adding a bit line driver (VBLDRV) and plate driver (PLDRV) for a test mode to the conventional circuit having the φt gates (φt clocking gates) between the memory cell array region and the sense amplifier region. FIG. 7 is a timing chart showing a series of operations in a test mode, for illustrating a test method of the ferroelectric memory according to the first embodiment of this invention. FIGS. 8 and 9 are waveform diagrams specifically showing the transition of potentials of respective nodes in the memory cell region of FIG. 6 when the test mode operation is performed.

In FIG. 6, memory cell units are arranged in a matrix form in the memory cell region. Each of the memory cell units is formed by serially connecting a plurality of memory cells which are each formed by connecting two electrodes of a ferroelectric capacitor to source and drain terminals of an E type N-channel MIS transistor (for example, an N-channel MOS transistor).

In this example, two memory cell units which are respectively formed of series-connected eight memory cells M0 to M7 and BM0 to BM7, for example, are typically shown. The cells M0 to M7 are respectively configured by transistors Tr0 to Tr7 and capacitors C0 to C7 and the cells BM0 to BM7 are respectively configured by transistors BTr0 to BTr7 and capacitors BC0 to BC7.

The gate electrodes of the transistors Tr0 to Tr7, BTr0 to BTr7 are respectively connected to corresponding word lines WL<0> to WL<7>. Further, one end of each memory cell unit is connected to one of plate lines PL<0> and PL<1> and the other end thereof is connected to one of bit lines BL and BBL which are complementary to each other via a block select MIS transistor (block selector) QB0 or QB1.

One of the word lines WL<0> to WL<7> is selected according to an address signal by a word line select circuit (not shown) and supplied with a corresponding one of word line driving potentials V(WL<0>) to V(WL<7>).

Further, the plate lines PL<0>, PL<1> are connected to a plate driver 13 and counter 14 for the test mode. In the normal operation mode, the plate driver 13 causes a plate line select circuit (not shown) to drive the plate lines PL<0>, PL<1> according to an address signal. In the test mode, a test signal is supplied to the counter 14, a plate line driving signal (PLDRV signal: refer to FIG. 7) supplied to the plate driver 13 is controlled according to a count value of the counter 14 and the pulse width and the pulse number of the PLDRV signal in the test mode are set.

The block select MIS transistors QB0, QB1 are respectively controlled by block select signals V(BS<0>), V(BS<1>).

Further, the bit lines BL, BBL are connected to a sense amplifier region 10. In the sense amplifier region 10, an equalization circuit EQ which equalizes potentials of the paired bit lines BL, BBL, a sense amplifier SA which compares and amplifies the potentials of the paired bit lines BL, BBL, and a column select gate CG.

NMIS transistors (φt gates) QS serially connected to the paired bit lines BL, BBL are inserted between the equalization circuit EQ and the sense amplifier SA and connection/disconnection between the equalization circuit EQ and the sense amplifier SA is selectively controlled by a separation control signal φt supplied to the gate electrodes of the transistors QS.

The equalization circuit EQ includes NMIS transistors QN and an NMIS transistor QE. The NMIS transistors QN are connected between the output node of a bit line driver 11 and the paired bit lines BL, BBL. The NMIS transistor QE is connected between the paired bit lines BL and BBL. The transistors QN, QE are controlled by an equalization control signal V(BEQL). The bit line driver 11 is supplied with a bit line driving signal (VBLDRV signal: refer to FIG. 7) and an output signal of a counter 12. The counter 12 is supplied with a test signal TST and the operation of the bit line driver 11 is controlled by an output signal of the counter 12. An output of the bit line driver 11 is set to ground potential VSS in the normal operation mode. In the test mode, the count value of the counter 12 is supplied to the bit line driver 11 to set the pulse width and pulse number of the VBLDRV signal.

The sense amplifier SA is configured by an N-channel MIS transistor section (NMIS section) and P-channel MIS transistor section (PMIS section). The NMIS section has paired sense nodes coupled with the paired bit lines BL, BBL and the activated/deactivated state thereof is controlled by a sense amplifier activation signal V(SEN). The PMIS section has paired sense nodes coupled with the paired bit lines BL, BBL and the activated/deactivated state thereof is controlled by a sense amplifier activation signal V(BSEP).

The NMIS section includes two NMIS transistors and one NMIS transistor. The drain terminals of the two NMIS transistors are respectively connected to the paired bit lines BL, BBL and the gate electrodes thereof are respectively connected to the paired bit lines BBL, BL. The one NMIS transistor is connected between each of the source terminals of the two NMIS transistors and the lower side ("L") potential VSS of the sense amplifier SA and the gate electrode thereof is supplied with the sense amplifier activation signal V(SEN).

The PMIS section includes two PMIS transistors and one PMIS transistor. The drain terminals of the two PMIS transistors are respectively connected to the paired bit lines BL, BBL and the gate electrodes thereof are respectively connected to the paired bit lines BBL, BL. The one PMIS transistor is connected between each of the source terminals of the two PMIS transistors and the higher side ("H") potential VSAH of the sense amplifier and the gate electrode thereof is supplied with the sense amplifier activation signal V(BSEP).

The column select gate CG includes NMIS transistors QG respectively connected to paired data lines DQ, BDQ which are commonly provided for a plurality of columns (that is, a plurality of bit line pairs BL, BBL). The NMIS transistors QG are controlled by a signal V(CSL) of a column select line CSL which is used to select the bit line pair BL, BBL of a desired column so as to transfer data of the bit line pair BL, BBL which has been subjected to the comparison/amplification operation by the sense amplifier SA of the corresponding column to the data line pair DQ, BDQ or program data input from outside the chip to a desired bit line pair BL, BBL.

Next, the operation for checking a reduction in the polarization amount due to pure fatigue of a ferroelectric thin film of a cell capacitor by repeatedly inverting the polarization states of the capacitors C0, BC0 of the memory cells M0, BM0 is explained in detail with reference to FIGS. 7 to 9. In this example, a case wherein the word line WL<0> is selected is considered. Further, assume that polarization which is set in a direction toward the bit line BL from the plate line PL<0> occurs in the capacitor C0 of the memory cell M0 which lies on the bit line BL side among the cells selected by the word line WL<0>; that is, data "0" is programmed in the cell M0 and polarization which is set in a direction toward the plate line PL<1> from the bit line BBL occurs in the capacitor BC0 of the memory cell BM0 which lies on the bit line BBL side; that is, data "1" is programmed in the cell BM0. In this case, both of the block select signals V(BS<0>, V(BS<1>) and equalization control signal V(BEQL) are set at the high level. Further, the paired bit lines BL, BBL are equalized to 0 V by the VBLDRV signal.

The potential of the word line WL<0> is lowered from the high level to the low level to make preparation for application of a potential difference across the cell. Then, the PLDRV signal is changed from the low level to the high level and from the high level to the low level. After this, the VBLDRV signal is changed from the low level to the high level and from the high level to the low level while the potential of the plate line PL<1> is kept at 0 V.

At this time, as shown in FIG. 7, if a period from the time the potential of the plate line PL<0> is lowered until the potential of the bit line BL is raised is denoted by τPB and a period from the time the bit line potential is lowered until the plate line potential is raised is denoted by τBP, then τPB>0 and τBP>0.

Further, the transition of potentials of the respective nodes shown in the memory cell region of FIG. 6 in the test mode is specifically shown in FIGS. 8 and 9. FIG. 8 shows the transition in a period from time t0 to time t1 in FIG. 7 and FIG. 9 shows the transition in a period from time t1 to time t2 in FIG. 7.

According to the configuration and test method described above, since the potentials of the plate lines PL<0>, PL<1> and the bit lines BL, BBL are not simultaneously set at the high level, the cell transfer gates Tr0 to Tr7, BTr0 to BTr7 are not turned OFF by a rise in the threshold voltages thereof due to the substrate bias effect so as to cause a potential difference to occur across each cell transfer gate, and the occurrence of disturbance acting as an electric field which weakens the polarization of the non-selected cell can be prevented. Further, the effect of fatigue of the ferroelectric thin film can be purely evaluated in a short time by reading out data from the cells M0 and BM0 based on the 1T1C operation after repeatedly performing the above operation.

[Second Embodiment]

Figure 10:
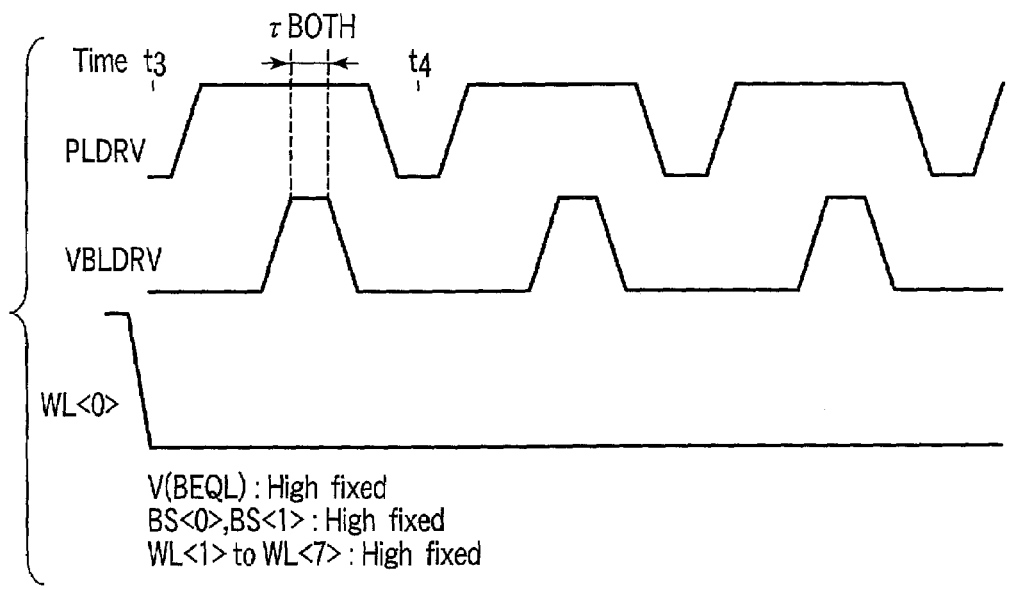
FIG. 10 is a timing chart showing a series of operations as a test mode operation, for illustrating a ferroelectric memory according to a second embodiment of this invention and a test method thereof.
Figure 11:
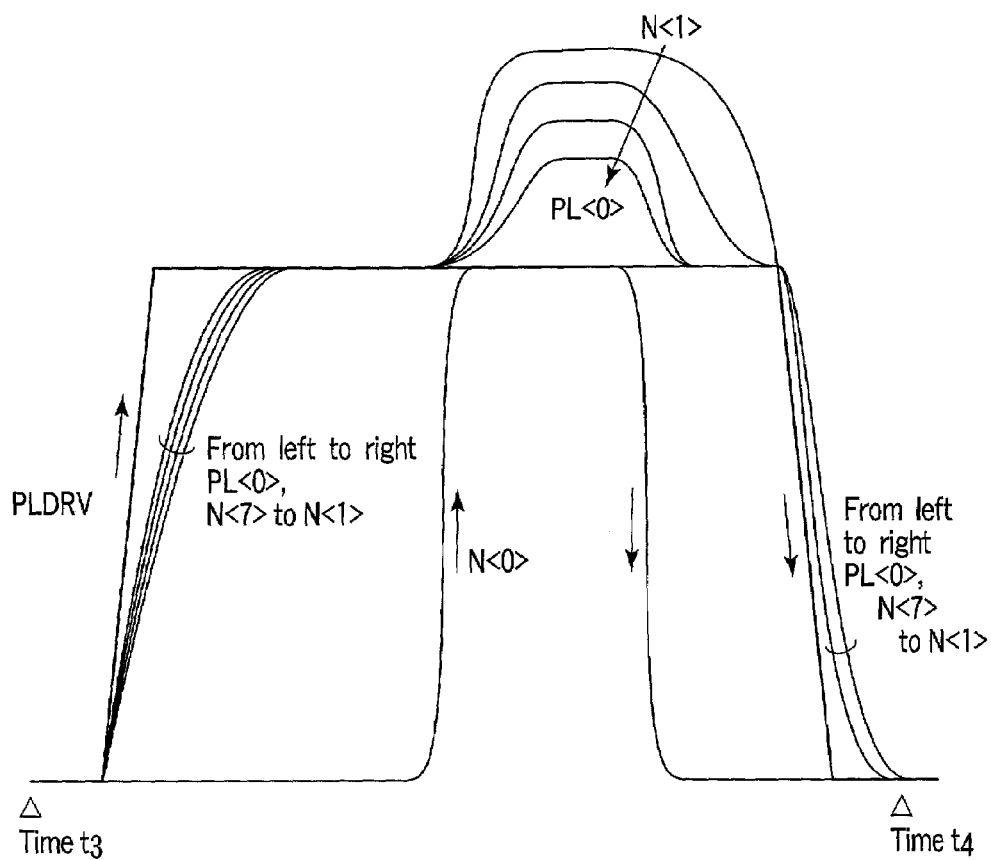
FIG. 11 is a waveform diagram specifically showing the transition of potentials of respective nodes N<0> to N<7> shown in the memory cell region of FIG. 6 in a period from time t3 to time t4 in FIG. 10.

FIG. 10 is a timing chart showing a series of operations as a test mode operation, for illustrating a ferroelectric memory according to a second embodiment of this invention and a test method thereof. FIG. 11 is a waveform diagram specifically showing the transition of potentials of respective nodes shown in the memory cell region of FIG. 6 at the test mode operation time in the present embodiment. The operation for checking a reduction in the polarization amount of a ferroelectric capacitor of a memory cell M1 due to disturbance is specifically explained with reference to FIGS. 10 and 11.

In this example, a case wherein a word line WL<0> is selected is considered. Further, assume that polarization which is set in a direction toward the bit line BL from the plate line PL<0> occurs in a capacitor C1 of a cell M1 which is adjacent to a cell M0 selected by the word line WL<0>; that is, data "0" is programmed in the cell M1. In this case, block select signals V(BS<0>, V(BS<1>) and equalization control signal V(BEQL) are set at the high level. Further, paired bit lines BL, BBL are equalized to 0 V by a VBLDRV signal.

The potential of the word line WL<0> is lowered from the high level to the low level to make preparation for application of a potential difference across the cell. Then, the operation is performed so that high level portions of the VBLDRV signal and PLDRV signal will overlap each other as shown in FIG. 10. That is, the potential of the bit line BL is raised after the potential of the plate line PL<0> is raised, and the potential of the plate line PL<0> is lowered after the potential of the bit line BL is lowered. Therefore, if a period in which both of the potentials of the plate line PL<0> and bit line BL are kept at the high level is denoted by τBOTH, then τBOTH>0.

In the above test method, since both of the potentials of the plate line PL<0> and bit line BL are set at the high level, the cell transfer gates Tr0 to Tr7 are turned OFF by a rise in the threshold voltages thereof due to the substrate bias effect so as to cause a potential difference to occur across each cell transfer gate, and it is possible to cause rapid occurrence of disturbance acting as an electric field which weakens the polarization of the non-selected cell M1. Further, a reduction in the polarization amount of the ferroelectric capacitor of the cell due to disturbance can be evaluated in a short time by reading out data from the cell M1 based on the 1T1C operation after repeatedly performing the above operation.

[Third Embodiment]

Figure 12:
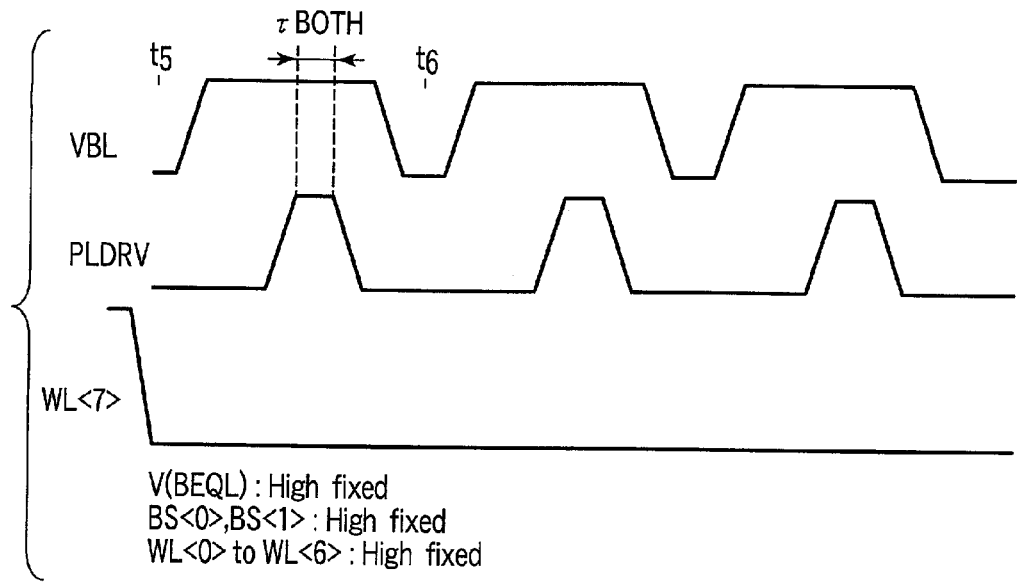
FIG. 12 is a timing chart showing a series of operations as a test mode operation, for illustrating a ferroelectric memory according to a third embodiment of this invention and a test method thereof.
Figure 13:
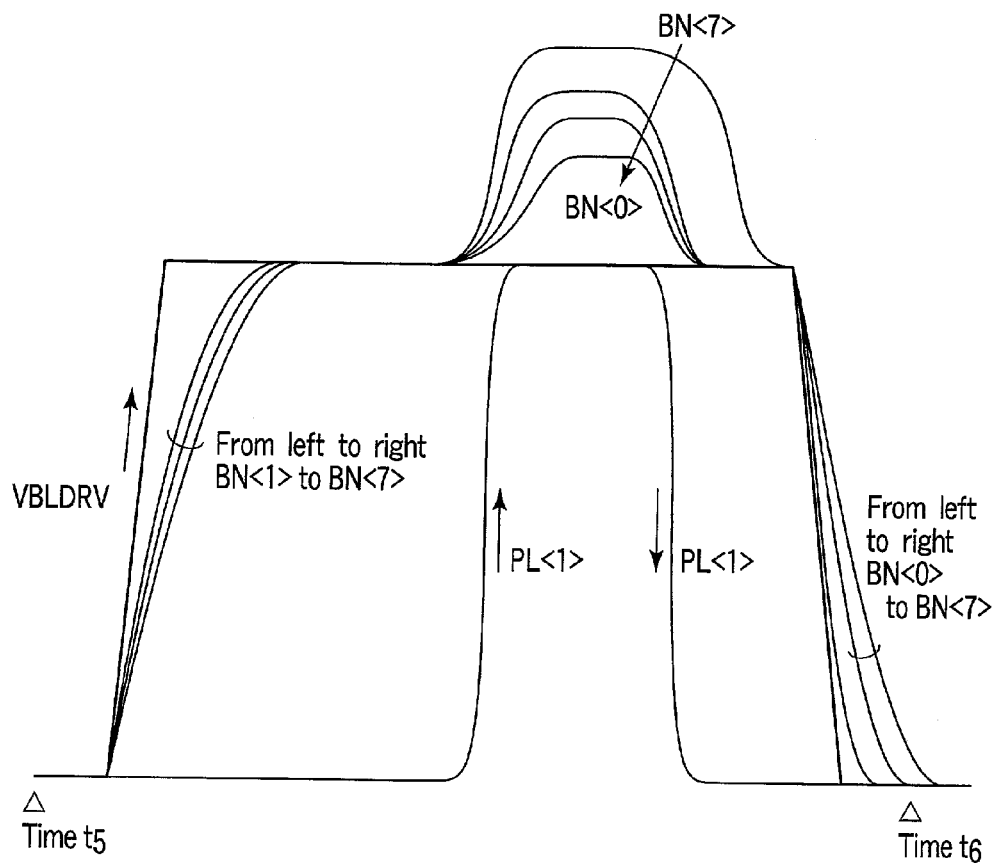
FIG. 13 is a waveform diagram specifically showing the transition of potentials of respective nodes BN<0> to BN<7> shown in the memory cell region of FIG. 6 in a period from time t5 to time t6 in FIG. 12.

FIG. 12 is a timing chart showing a series of operations as a test mode operation, for illustrating a ferroelectric memory according to a third embodiment of this invention and a test method thereof. FIG. 13 specifically shows the transition of potentials of respective nodes shown in a memory cell region of FIG. 6 at the test mode operation time in the present embodiment. The operation of the present embodiment for checking a reduction in the polarization amount of a ferroelectric capacitor of a memory cell BM6 due to disturbance is specifically explained with reference to FIGS. 12 and 13.

In this example, a case wherein a word line WL<7> is selected is considered. Further, assume that polarization which is set in a direction toward the plate line PL<1> from the bit line BBL occurs in a capacitor BC6 of a cell M6 which is adjacent to a cell BM7 selected by the word line WL<7>; that is, data "1" is programmed in the cell BM6. In this case, block select signals V(BS<0>, V(BS<1>) and equalization control signal V(BEQL) are set at the high level. Further, the paired plate lines PL<0>, PL<1> are set to 0 V by a PLDRV signal.

The potential of the word line WL<0> is lowered from the high level to the low level to make preparation for application of a potential difference across the cell. Then, the operation is performed so that high level portions of the PLDRV signal and VBLDRV signal will overlap each other as shown in FIG. 12. That is, the potential of the plate line PL<1> is raised after the potential of the bit line BBL is raised, and the potential of the bit line BBL is lowered after the potential of the plate line PL<1> is lowered. Therefore, if a period in which both of the potentials of the plate line PL<1> and bit line BBL are kept at the high level is denoted by τBOTH, then τBOTH>0.

In the above test method, since both of the potentials of the plate line PL<1> and bit line BBL are set at the high level, the cell transfer gates BTr0 to BTr7 are turned OFF by a rise in the threshold voltages thereof due to the substrate bias effect so as to cause a potential difference to occur across each cell transfer gate, and it is possible to cause rapid occurrence of disturbance acting as an electric field which weakens the polarization of the non-selected cell BM6. Further, a reduction in the polarization amount of the ferroelectric capacitor of the cell due to disturbance can be evaluated in a short time by reading out data from the cell BM6 based on the 1T1C operation after repeatedly performing the above operation.

[Fourth Embodiment]

Figure 14:
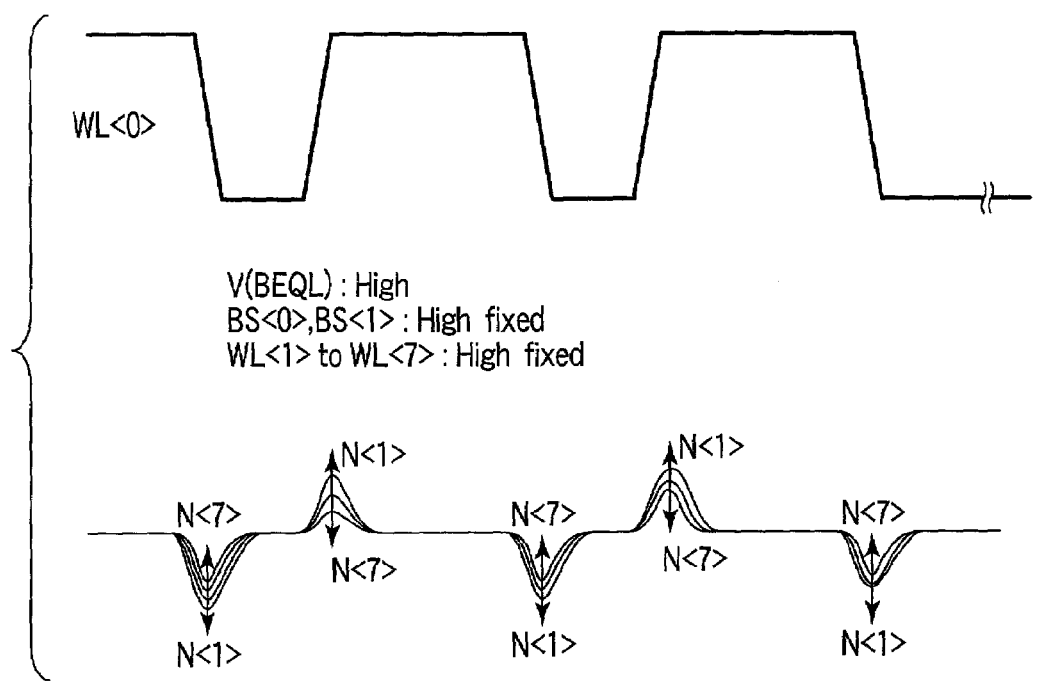
FIG. 14 is a timing chart showing a series of operations as a test mode operation and a waveform diagram specifically showing the transition of potentials of respective nodes shown in the memory cell region of FIG. 6, for illustrating a ferroelectric memory according to a fourth embodiment of this invention and a test method thereof.

FIG. 14 is a timing chart showing a series of operations as a test mode operation and a waveform diagram specifically showing the transition of potentials of respective nodes shown in the memory cell region of FIG. 6, for illustrating a ferroelectric memory according to a fourth embodiment of this invention and a test method thereof. In this example, a case wherein a word line WL<0> is selected is considered. Further, assume that polarization which is set in a direction toward the bit line from the plate line occurs in a capacitor C1 of a cell M1 which is adjacent to the word line WL<0>; that is, data "0" is programmed in the cell M1 and polarization which is set in a direction toward the plate line from the bit line occurs in a capacitor BC1 of a cell BM1; that is, data "1" is programmed in the cell BM1.

The operation of the present embodiment for checking the effect of disturbance caused with respect to the polarizations of the memory cells M1 and BM1 by repeatedly turning ON/OFF (selecting/non-selecting) the word line WL<0> is specifically explained with reference to FIG. 14. In this case, block select signals V(BS<0>, V(BS<1>) and equalization control signal V(BEQL) are set at the high level. Further, paired bit lines and paired plate lines are set to 0 V by a VBLDRV signal and PLDRV signal, respectively.

The operation for changing the potential of the word line WL<0> from the low level to the high level and then from the high level to the low level is performed once or repeatedly performed plural times. By coupling between the word line WL<0> and the electrodes of the non-selected memory cells M1 and BM1 on the bit line BL side, a potential difference occurs between the ferroelectric thin film electrodes of the above cells, and it is possible to cause rapid occurrence of disturbance acting as an electric field which weakens the polarization of the non-selected cell. Further, a reduction in the polarization amount due to disturbance can be evaluated in a short time by reading out data from the cells M1 and BM1 after performing the above operation once or plural times.

[Fifth Embodiment]

Figure 15:
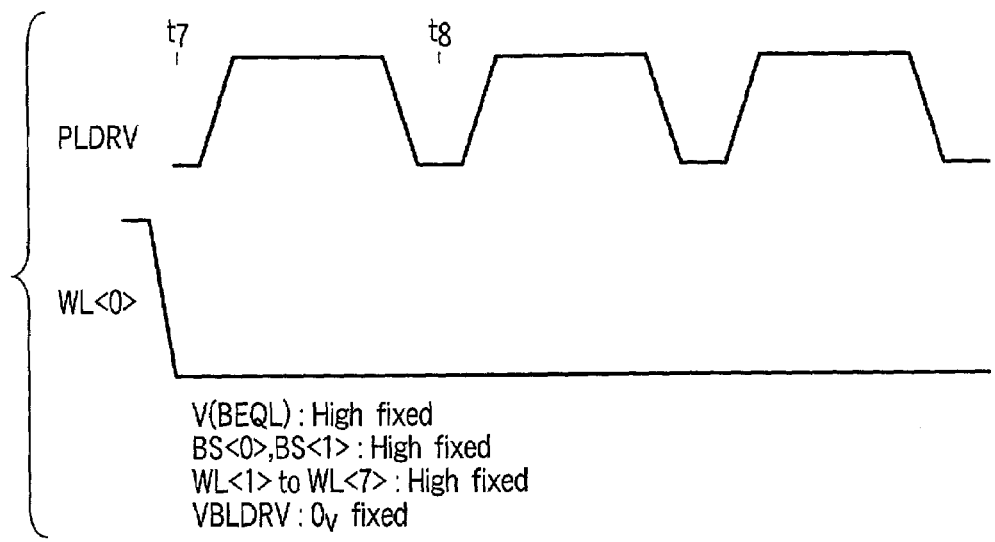
FIG. 15 is a timing chart showing a series of operations as a test mode operation, for illustrating a ferroelectric memory according to a fifth embodiment of this invention and a test method thereof.
Figure 16:
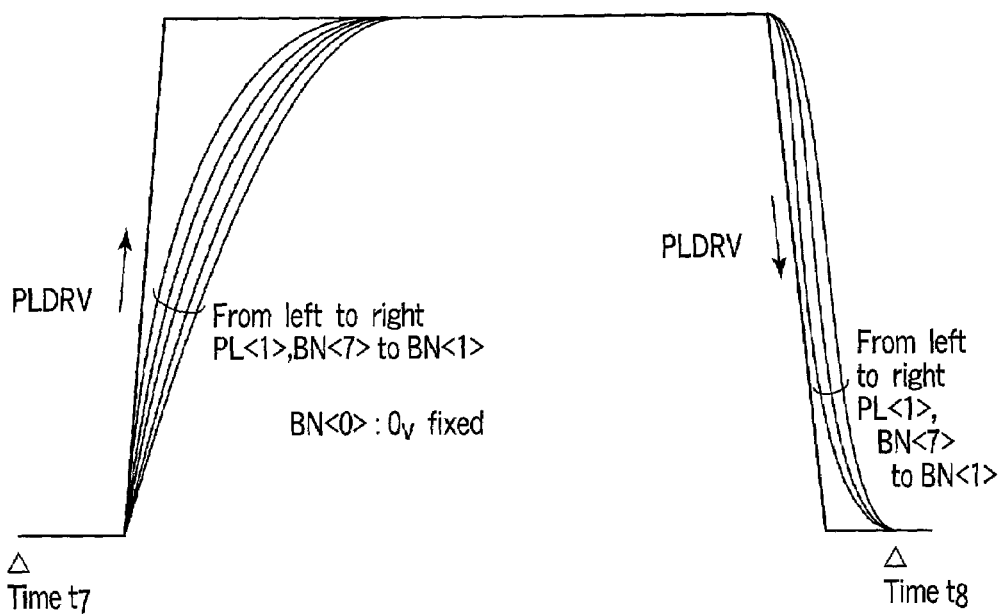
FIG. 16 is a waveform diagram specifically showing the transition of potentials of respective nodes BN<0> to BN<7> shown in the memory cell region of FIG. 6 in a period from time t7 to time t8 in FIG. 15.

FIG. 15 is a timing chart showing a series of operations as a test mode operation, for illustrating a ferroelectric memory according to a fifth embodiment of this invention and a test method thereof. FIG. 16 is a waveform diagram specifically showing the transition of potentials of respective nodes shown in the memory cell region of FIG. 6 at the test mode operation time in the present embodiment. In this example, a case wherein a word line WL<0> is selected is considered. Further, assume that polarization which is set in a direction toward the plate line PL<1> from the bit line BBL occurs in a capacitor BC7 of a cell BM7; that is, data "1" is programmed in the cell BM7.

The operation of the present embodiment for checking the effect of disturbance caused with respect to the polarization of the memory cell BM7 by changing a PLRV signal from the low level to the high level and then from the high level to the low level is specifically explained with reference to FIGS. 15 and 16. In this case, block select signals V(BS<0>, V(BS<1>) and equalization control signal V(BEQL) are set at the high level. Further, the paired bit lines BL, BBL are equalized to 0 V by a VBLDRV signal.

The potential of the word line WL<0> is lowered from the high level to the low level to make preparation for application of a potential difference across a cell BM0. Then, the PLDRV signal is changed from the low level to the high level and then from the high level to the low level one time or plural times. By the presence of the ON-resistances of the cells BM0 to BM6 and the capacitive components thereof, a potential difference occurs between the ferroelectric capacitor electrodes of the cell BM7, and it is possible to cause rapid occurrence of disturbance acting on the polarization. Further, a reduction in the polarization amount of the cell due to disturbance can be evaluated in a short time by reading out data from the cell BM7 based on the 1T1C operation after performing the above operation one time or plural times.

[Sixth Embodiment]

Figure 17:
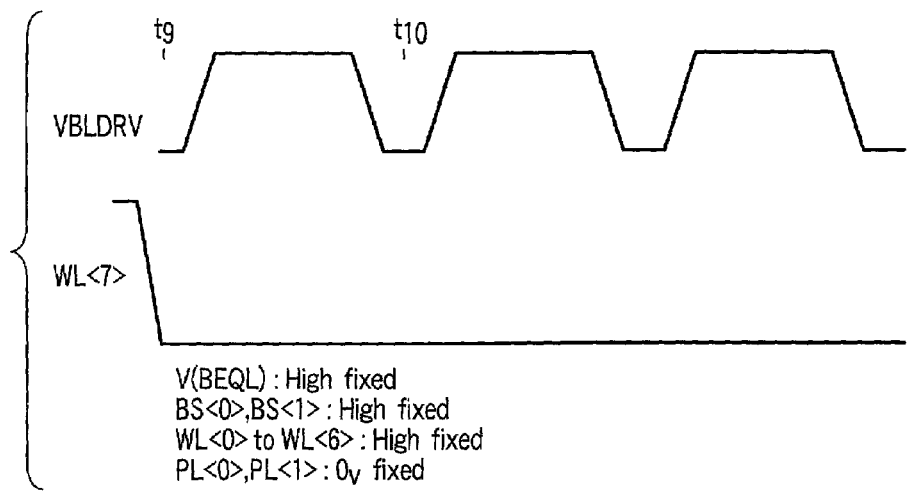
FIG. 17 is a timing chart showing a series of operations as a test mode operation, for illustrating a ferroelectric memory according to a sixth embodiment of this invention and a test method thereof.
Figure 18:
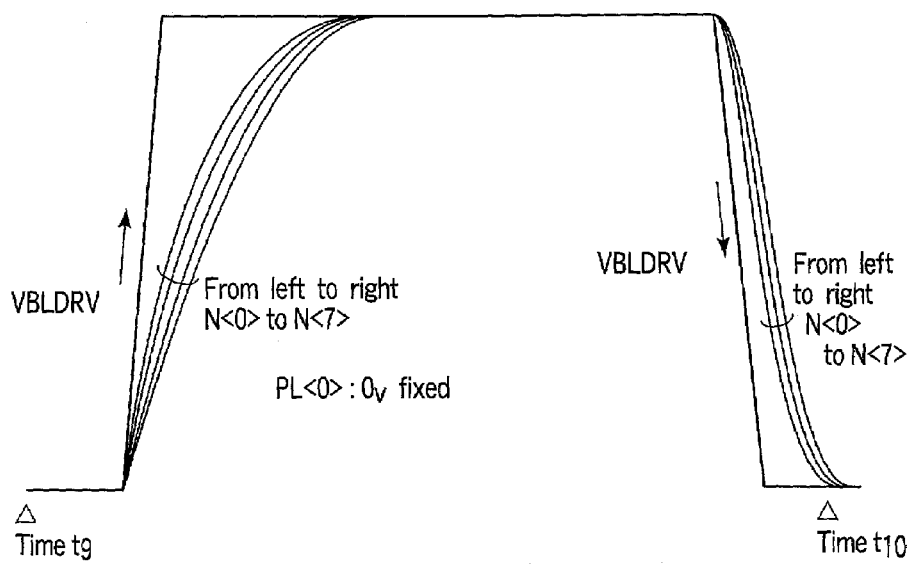
FIG. 18 is a waveform diagram specifically showing the transition of potentials of respective nodes N<0> to N<7> shown in the memory cell region of FIG. 6 in a period from time t9 to time t10 in FIG. 17.

FIG. 17 is a timing chart showing a series of operations as a test mode operation, for illustrating a ferroelectric memory according to a sixth embodiment of this invention and a test method thereof. FIG. 18 is a waveform diagram specifically showing the transition of potentials of respective nodes shown in the memory cell region of FIG. 6 at the test mode operation time in the present embodiment. In this example, a case wherein a word line WL<7> is selected is considered. Further, assume that polarization which is set in a direction toward the bit line BL from the plate line PL<0> occurs in a capacitor C0 of a cell M0; that is, data "0" is programmed in the cell M0.

The operation of the present embodiment for checking the effect of disturbance caused with respect to the polarization of the memory cell M0 by changing a VBLDRV signal from the low level to the high level and then from the high level to the low level is specifically explained with reference to FIGS. 17 and 18. In this case, block select signals V(BS<0>, V(BS<1>) and equalization control signal V(BEQL) are set at the high level. Further, the paired bit lines BL, BBL are equalized to 0 V by the VBLDRV signal. The potential of the word line WL<7> is lowered from the high level to the low level to make preparation for application of a potential difference across a cell M7. Then, the VBLDRV signal is changed from the low level to the high level and then from the high level to the low level one time or plural times. By the presence of the ON-resistances of the cells BM0 to BM6 and the capacitive components thereof, a potential difference occurs between the ferroelectric capacitor electrodes of the cell M0, and it is possible to cause rapid occurrence of disturbance acting on the polarization. Further, a reduction in the polarization amount of the cell due to disturbance can be evaluated at high speed by reading out data from the cell M0 based on the 1T1C operation after performing the above operation one time or plural times.

In the first to sixth embodiments, the counters 14, 12 are respectively connected to the plate driver 13 and bit line driver 11 for the test mode and the plate driver 13 and bit line driver 11 are controlled in the test mode by use of the counters 14, 12, but it is of course possible to use a logic circuit having the same function.

Further, the counters 14, 12 are controlled by the test signal TST, but it is also possible to independently control them by use of different signals.

In addition, if a tester is used to supply signals which are similar to the output signals of the plate driver 13 and bit line driver 11 for the test mode, the plate driver 13 and bit line driver 11 can be omitted.

As described above, according to one aspect of this invention, it is possible to provide a ferroelectric memory and a test method thereof in which a pulse is repeatedly applied to a non-selected cell at high speed to invert the polarization thereof without applying disturbance to the non-selected cell and a pure fatigue characteristic can be evaluated in a short time.

Further, it is possible to provide a ferroelectric memory and a test method thereof in which disturbance is repeatedly applied to a non-selected cell at high speed and a reduction in the polarization amount can be evaluated in a short time.

Also, it is possible to provide a ferroelectric memory and a test method thereof in which disturbance caused by coupling between the word line and the electrode of an adjacent cell capacitor is repeatedly applied to a non-selected cell at high speed by raising and lowering the potential of the word line at high speed and a reduction in the polarization amount can be evaluated in a short time.

Further, it is possible to provide a ferroelectric memory and a test method thereof in which disturbance caused by the presence of the ON-resistance and capacitive component of a transistor of a non-selected cell is repeatedly applied to the non-selected cell at high speed by driving the plate line or bit line at high speed and the effect of the disturbance can be evaluated in a short time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A test method for a ferroelectric memory including a circuit of a plurality of series-connected memory cells which is connected at one end to a plate line, each of said plurality of series-connected memory cells including a first MIS transistor which has a gate electrode connected to a corresponding one of plural word lines, a source terminal and a drain terminal and a ferroelectric capacitor connected between said source terminal and said drain terminal, and a second MIS transistor having a current path which is connected at one end to the other end of said circuit of said plurality of series-connected memory cells and connected at the other end to a bit line, said test method comprising:

lowering a potential of a word line connected to any selected one of said memory cells and raising a potential of word lines connected to non-selected memory cells;

raising a potential of said plate line from a first potential to a second potential and then lowering said potential of said plate line from said second potential to said first potential;

raising a potential of said bit line from a third potential to a fourth potential and then lowering said potential of said bit line from said fourth potential to said third potential; and reading data from said memory cells after said potentials of said plate line and said bit line have been raised and lowered at least one time, to determine attenuation of polarization in said ferroelectric capacitor, wherein said bit line remain at said third potential while said plate line is maintained at said second potential, and said plate line is maintained at said first potential while said bit line remains at said fourth potential.

2. The test method of the ferroelectric memory according to claim 1, wherein after a predetermined period of time after one of the potentials of the plate line and the bit line is lowered, the other of the potentials of the plate line and the bit line is raised to a high level so that the potentials of the both the plate line and the bit line are not set at the high level simultaneously.

3. A test method for a ferroelectric memory including a circuit of a plurality of series-connected memory cells which is connected at one end to a plate line, each of said plurality of series-connected memory cells including a first MIS transistor which has a gate electrode connected to a corresponding one of plural word lines, a source terminal and a drain terminal and a ferroelectric capacitor connected between said source terminal and said drain terminal, and a second MIS transistor having a current path which is connected at one end to the other end of said circuit of said plurality of series-connected memory cells and connected at the other end to a bit line, said test method comprising:

lowering a potential of a word line connected to any selected one of said memory cells and raising a potential of word lines connected to non-selected memory cells;

raising a potential of said plate line to a prescribed value, maintaining said potential of said plate line at said prescribed value during a predetermined period, and lowering said potential of said plate line from said prescribed value;

raising and lowering said potential of said bit line during said predetermined period; and reading data from said memory cells after said potentials of said plate line and said bit line have been raised and lowered at least one time, to determine attenuation of polarization in said ferroelectric capacitor.

4. A test method for a ferroelectric memory including a circuit of a plurality of series-connected memory cells which is connected at one end to a plate line, each of said plurality of series-connected memory cells including a first MIS transistor which has a gate electrode connected to a corresponding one of plural word lines, a source terminal and a drain terminal and a ferroelectric capacitor connected between said source terminal and said drain terminal, and a second MIS transistor having a current path which is connected at one end to the other end of said circuit of said plurality of series-connected memory cells and connected at the other end to a bit line, said test method comprising:

lowering a potential of a word line connected to any selected one of said memory cells and raising a potential of word lines connected to non-selected memory cells;

raising a potential of said bit line to a prescribed value, maintaining said potential of said bit line at said prescribed value during a predetermined period, and lowering said potential of said bit line from said prescribed value;

raising and lowering said potential of said plate line during said predetermined period; and reading data from said memory cells after said potentials of said plate line and said bit line have been raised and lowered at least one time, to determine attenuation of polarization in said ferroelectric capacitor.

5. A ferroelectric memory comprising:

a memory cell unit which is configured by serially connecting a plurality of memory cells each of which is configured by respectively connecting two electrodes of a ferroelectric capacitor to a source terminal and a drain terminal of a MIS transistor, a plurality of word lines respectively connected to gate electrodes of said MIS transistors of said memory cell unit, a plate line connected to one end of said memory cell unit, a plate driver which applies a fixed potential to said plate line in a normal operation mode and pulse-drives said plate line in a test mode, a bit line connected to the other end of said memory cell unit via a block select switch element, a bit line driver which applies a fixed potential to said bit line in said normal operation mode and pulse-drives said bit line in said test mode, a first counter which controls said plate driver in response to a test signal, and a second counter which controls said bit line driver in response to said test signal, wherein a pulse number and pulse width in said test mode are set based on count values of said first and second counters, and stresses are repeatedly applied to the two electrodes of the ferroelectric capacitor based on the count values of said first and second counters while avoiding occurrence of a disturbance or disturbing the cells.

6. The ferroelectric memory according to claim 5, wherein said plate driver and said bit line driver are operated in response to a common test signal.

7. The ferroelectric memory according to claim 5, wherein said plate driver and said bit line driver are independently operated.

* * * * *